United States Patent [19]
Roll-Mecak et al.

[11] Patent Number: 5,479,610
[45] Date of Patent: Dec. 26, 1995

[54] SYSTEM INTERFACE FAULT ISOLATOR TEST SET

[75] Inventors: Doru T. Roll-Mecak, Long Beach; Stanley Teich, Melville, both of N.Y.

[73] Assignee: Northrop Grumman Corporation, Los Angeles, Calif.

[21] Appl. No.: 144,318

[22] Filed: Nov. 1, 1993

[51] Int. Cl.[6] .................................................. G01R 31/28
[52] U.S. Cl. ..................................... 395/183.01; 324/534
[58] Field of Search ................................... 371/15.1, 22.4, 371/25.1, 27; 364/267.7; 324/527, 528, 533, 500, 512, 534; 395/575

[56] References Cited

U.S. PATENT DOCUMENTS

| | | | |
|---|---|---|---|
| 4,541,031 | 9/1985 | Ibbetson . | |
| 4,629,835 | 12/1986 | Miller . | |
| 4,739,276 | 4/1988 | Graube | 324/534 |
| 4,766,386 | 8/1988 | Oliver et al. | 324/533 |
| 4,786,857 | 11/1988 | Mohr et al. . | |
| 4,838,690 | 6/1989 | Buckland et al. . | |
| 4,970,466 | 11/1990 | Bolles et al. | 324/533 |
| 5,083,080 | 1/1992 | Tagiri | 324/118 |
| 5,185,579 | 2/1993 | Mertens et al. | 324/527 |
| 5,352,984 | 10/1994 | Piesinger | 324/532 |
| 5,361,776 | 11/1994 | Samuelson et al. | 128/734 |

*Primary Examiner*—Robert W. Beausoliel, Jr.
*Assistant Examiner*—Albert Décady
*Attorney, Agent, or Firm*—Terry J. Anderson; Karl J. Hoch, Jr.

[57] ABSTRACT

A system interface fault isolator uses time domain reflectometry test techniques to isolate faults from only one end of a cable, a cable string or component without requiring removal of the cable or component from the system interface. A separate maintenance control unit includes a mass storage means for storing TDR or VSWR signatures of a variety of systems and comparing the signatures with data obtained by the TDR measurement board connected to the cable or component to be tested. VSWR data is obtained by processing the TDR data using software built-in the maintenance control unit. The control unit is programmable to accommodate a variety of different system interfaces, and bit status data can be downloaded directly to the control unit. Two adaptors are also provided, one of which is connected to the control unit to analyze a multi-line digital bus, and the other of which allows differential TDR measurements to be taken by the SI-FI on a MIL-STD-1553 bus.

21 Claims, 5 Drawing Sheets

SYSTEM INTERFACE FAULT ISOLATOR TEST SET

BACKGROUND OF THE INVENTION

1. Field of the Invention

This invention relates to apparatus for fault isolation of failures in system interfaces.

2. Description of Related Art

Historically, isolation of failures in complex system interfaces such as those found in aircraft has been impossible without complete removal of the interface cables and other components from the system for testing. Removal and replacement of cables is often time-consuming, and can be especially disadvantageous in combat situations.

This disadvantage is compounded by the fact that fault isolation in complex system interfaces has generally required a large number of test sets, adding to the cost, inconvenience, and difficulty of performing fault isolation. Typical components which may need to be tested include: phase and/or time matched RF cables and/or RF cable strings; passive RF components such as: RF dividers, couplers, switches and antennas; data communication components such as: MIL-STD-1553 bus cables, couplers and connectors; parallel bus cables and junction boxes; and general system interface wiring and connections. No current test system is capable of field testing of all of these components without requiring removal of at least the interface cables and the use of a plurality of different test sets.

Additional disadvantages of currently deployed test sets for system interfaces include: low accuracy and an inability to test time matched RF cables. The low accuracy makes it impossible to resolve failures caused, for instance, by a defective or improperly mated RF connector, while the inability to perform time matching tests precludes testing of modern avionics. These capabilities are presently available only in laboratory instruments, which are unsuitable for the type of fault isolation to which the present invention relates.

Another disadvantage of currently deployed test sets is the inability to easily tailor them for specific applications. The above list of components is by no means exclusive, and each interface is arranged in a different fashion, making customization essential.

SUMMARY OF THE INVENTION

It is a first objective of the invention to provide a system interface fault isolation (SI-FI) test set capable of in situ fault isolation to a defective component in a system interface path, without necessitating the removal of such components from the system to be tested.

It is a second objective of the invention to provide a SI-FI test set which has high resolution and accuracy, and which is therefore capable of making time domain reflectometry (TDR) measurements on time matched and phase matched RF cables.

It is a third objective of the invention to provide a SI-FI test set which can accurately pinpoint failures to a specific component in a signal path.

It is a fourth objective of the invention to provide a SI-FI test set which can accurately pinpoint failures to a specific connection device in a signal path.

It is a fifth objective of the invention to provide a SI-FI test set which computes voltage standing wave ratios (VSWR) from TDR measurements.

It is a sixth objective of this invention to provide a SI-FI test set which allows these measurements to be performed from one end of a cable or cable string only, without necessitating the removal of such cable or cable string from the system being tested.

It a seventh objective of this invention to provide a SI-FI test set which can perform digital oscilloscope measurements and digital multimeter measurements in addition to TDR measurements in a single unit.

It is an eighth objective of this invention to provide a SI-FI test set which is portable and ruggedized and which is therefore capable of being used at the Organizational Level of maintenance.

It is a ninth objective of the invention to provide a maintenance control unit which can be used either as the SI-FI controller or as a stand alone maintenance processor.

It is a tenth objective of this invention to provide a maintenance control unit which can directly interface with the MIL-STD-1553 data bus, and which can be used as either a remote terminal, bus controller or bus analyzer for test and/or fault isolation.

It is an eleventh objective of this invention to provide a maintenance control unit which can directly interface to a variety of parallel data buses, and which can be used as either a remote terminal, bus controller or bus analyzer on said plurality parallel buses.

It is a twelfth objective of this invention to provide a maintenance control unit which can be used to communicate with the control means of a plurality of systems, and which is therefore capable of initiating and exercising the Built-in Test functions of said plurality of systems.

It is a thirteenth objective of this invention to provide a maintenance control unit which can download and store the results of said Built-In Test functions of said plurality of systems.

It is a fourteenth objective of the invention to provide a SI-FI test set which is menu driven, user friendly and which automates testing and analysis; in which reference data, test limits data and test results data for a plurality of units under test (UUTs) can be stored in a mass storage device in such a manner that all references to any of the afore mentioned data can be associated with an individual UUT of the plurality of UUTs; in which automated menu driven test programs can be created, and which can be easily tailored for specific applications.

These and other objectives of the invention are achieved by providing a system interface fault isolator which uses time domain reflectometry techniques to test and isolate faults from one end of a cable or component and without requiring removal of the cable or component from the system. A separate maintenance control unit provides the processing means and the mass storage means for processing and storing reference data, test limits and test results for a plurality of systems. The maintenance control unit is programmable to accommodate a variety of different interfaces to be tested. Two adaptors are provided, one of which allows the SI-FI to test and/or control a variety of parallel digital buses, and the other of which allows differential TDR measurements to be taken by the SI-FI on a MIL-STD-1553 bus.

DETAILED DESCRIPTION OF THE PREFERRED EMBODIMENTS

Figure 1:
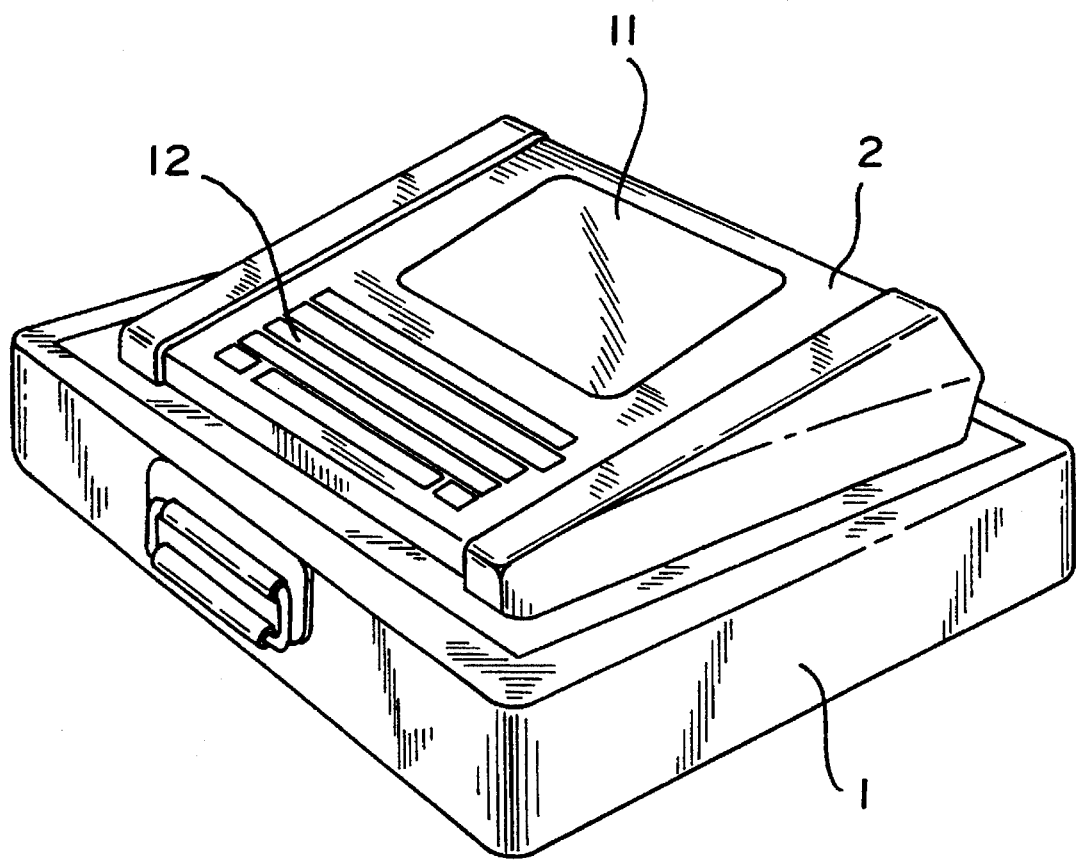
FIG. 1 is a perspective drawing of a system interface fault isolator according to a preferred embodiment of the invention.

FIG. 1 is a perspective view of the system interface fault isolator (SI-FI) apparatus of a preferred embodiment of the invention. The preferred SI-FI apparatus is composed of a TDR/oscilloscope unit 1, which contains the TDR/digital oscilloscope measurement functions, and a maintenance control unit (MCU) 2, which is similar in shape and size with a laptop type computer. The dimensions of the combined apparatus are no more than those of a large briefcase, and thus the apparatus is portable and easily transported to the site of the interface to be tested.

Figure 2:
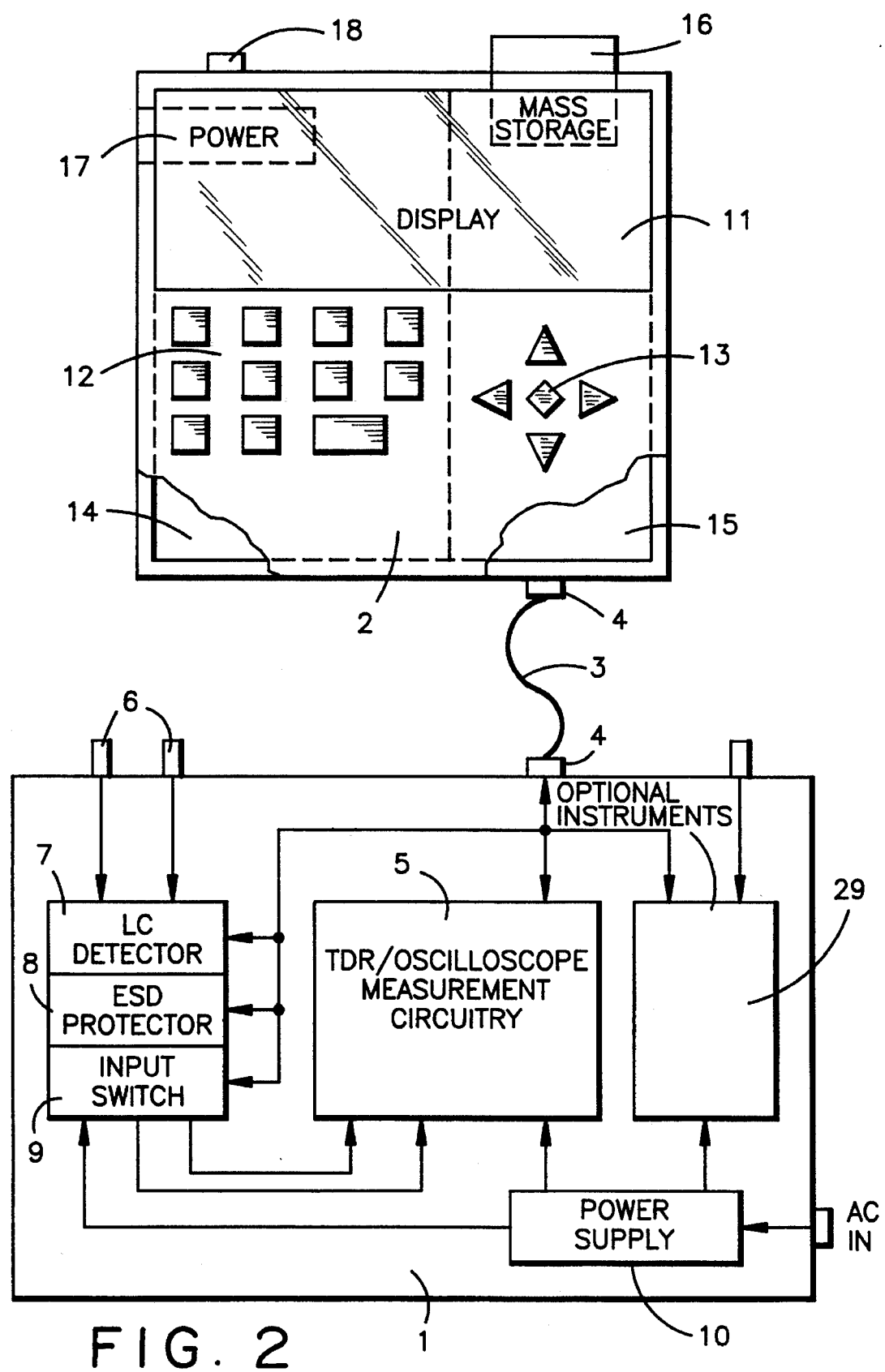
FIG. 2 is a schematic diagram showing the principal components of the SI-FI unit of FIG. 1, the principal components of the maintenance control unit of FIG. 1 and the interconnecting means between the afore mentioned units.
Figure 3:
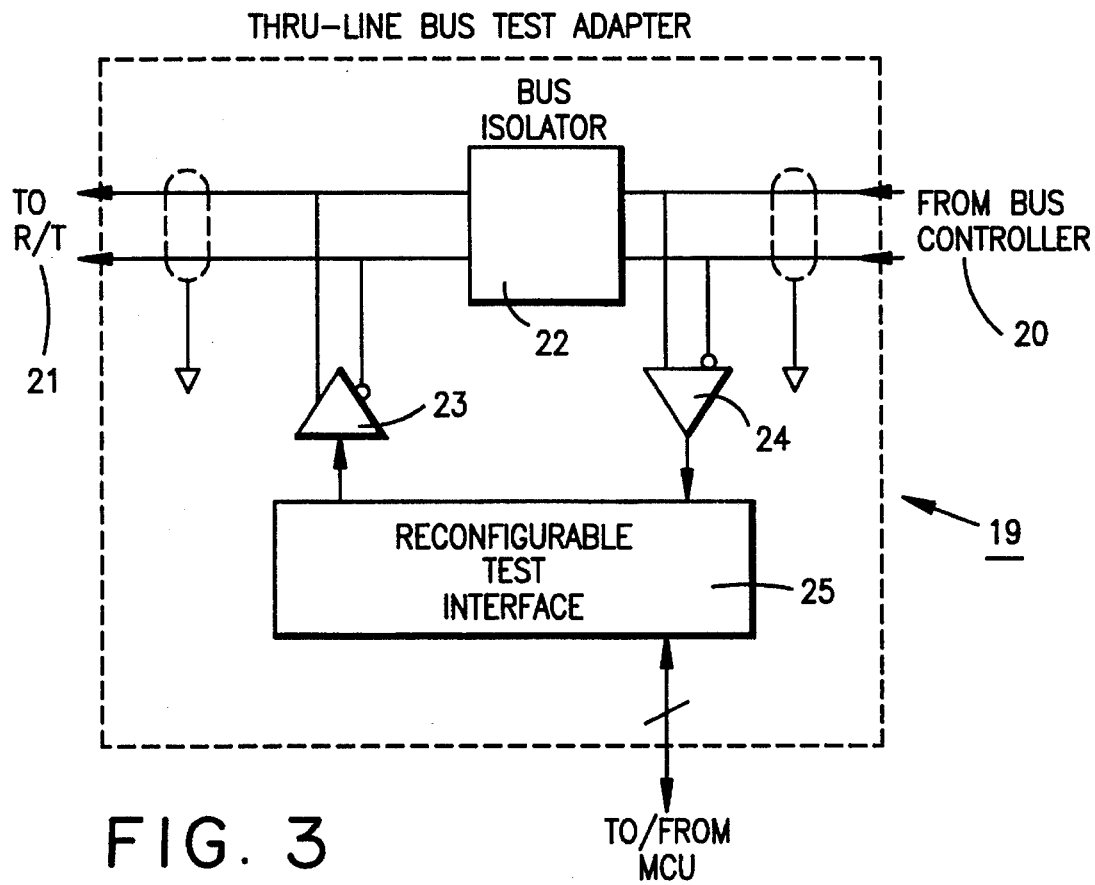
FIG. 3 is a schematic drawing of a parallel bus test adaptor for the SI-FI unit of FIG. 1.

As shown in FIG. 2, TDR/oscilloscope unit 1 is connected to the MCU 2 by an industry-standard General Purpose Interface Bus (GPIB) 3, which is mechanically connected through a connecting means 4 located on the casing of the units to a TDR/oscilloscope measurement means 5 positioned within the unit for performing TDR and/or digital oscilloscope measurements. Connecting means 6 are provided for two input channels.

Preferably the TDR/oscilloscope measurement means 5 is connected to the pair of input channels 6 via a test interface which contains: 1) a Live Circuit (LC) detector means 7 which determines if there are any signals present which may disturb the measurements or damage the test apparatus; 2) an Electro-Static Discharge (ESD) protector means 8 which discharges any capacitively-stored energy from the UUT before measurements are made in order to protect the test apparatus and the UUT from stray ESD; and 3) Input Switch means 9 which routes the input channels 6 to the appropriate measurement function of the TDR/oscilloscope measurement means 5.

A built-in power supply means 10 is also supplied to allow the SI-FI to operate with standard a power input of, for example, 115 Volts AC power at 60 Hz or 400 Hz.

The TDR/oscilloscope measurement means 5 is provided within the unit 1 for performing time domain reflectometry measurements, from which both the type of fault and the distance thereto can be determined. The time domain reflectometer and digital oscilloscope measurement means 5 is conventional and forms no part of the present invention, but it is noted that it can easily be designed by those skilled in the art to desired specifications.

MCU 2 contains a display means 11, a keyboard data entry means 12 and a pointing device means 13; these components constituting the user interface means of the MCU. In addition, the MCU also contains a computer/processor card 14, interface card 15 and a mass storage means 16. A power system means 17 is provided to allow the MCU to operate from either the same power input means as the SI-FI unit, or from battery power means for independent operation. The computer card 14 includes, for example: an Intel 386SL microprocessor, display adapter, memory devices, serial and parallel I/O, keyboard and pointing device interface means, while the interface card provides power management control and interfaces for an IEEE-488 bus, a MIL-STD 1553 bus and a plurality of digital discrete lines including, for example, a set of discrete lines which conforms to the specification for U.S. Navy memory loader control signals.

In addition, the computer card 14 of the MCU 2 includes all embedded application software as well as a basic input-output system (BIOS) stored in programmable, non-volatile devices known as FLASH memories. The MCU computer card 15 has the capability to relinquish control of an embedded Computer Card Program Loader and Firmware Update Module, which is resident in the FLASH memories, to an external host computer system when that external system is connected to the MCU by means of the serial communication port 18. The external host computer system is given control over the Computer Card Program Loader and Firmware Update Module in order to provide a means to update and revise the MCU embedded application software without the need for removing the MCU computer card 15 or any components thereof such as the FLASH memories from the MCU 2.

Testing is preferably performed via a menu driven test program. Details of the test program depend on the type of device or system to be tested, but are well within the ability of those skilled in the art to implement given the programability of the MCU, which in the example shown utilizes an Intel 386SL microprocessor. Reference data and test limits for the unit-under-test (UUT) are stored in the MCU mass storage 16, which can be fixed or removeable or a combination thereof. This arrangement has the advantage that when testing a component or path, only a specific part number or path reference designation need be entered on the MCU keyboard 12 or selected from an appropriate menu on a display 11 via a pointing device 13 in order to recall the appropriate specifications and test limits from the MCU mass storage 16 and cause the SI-FI to, for example: automatically initiate a TDR measurement, compare the test results to stored test limits or reference data stored on the MCU mass storage 16, determine if a failure was detected, determine the type of fault either directly from the measurement or by comparing the measurement with fault reference data from a library of faults also stored in the MCU mass storage 16, measure the exact distance to the fault, display the test results in pass/fail format, display the measured test waveform and also display a reference waveform also stored in the MCU mass storage 16.

Figure 4:
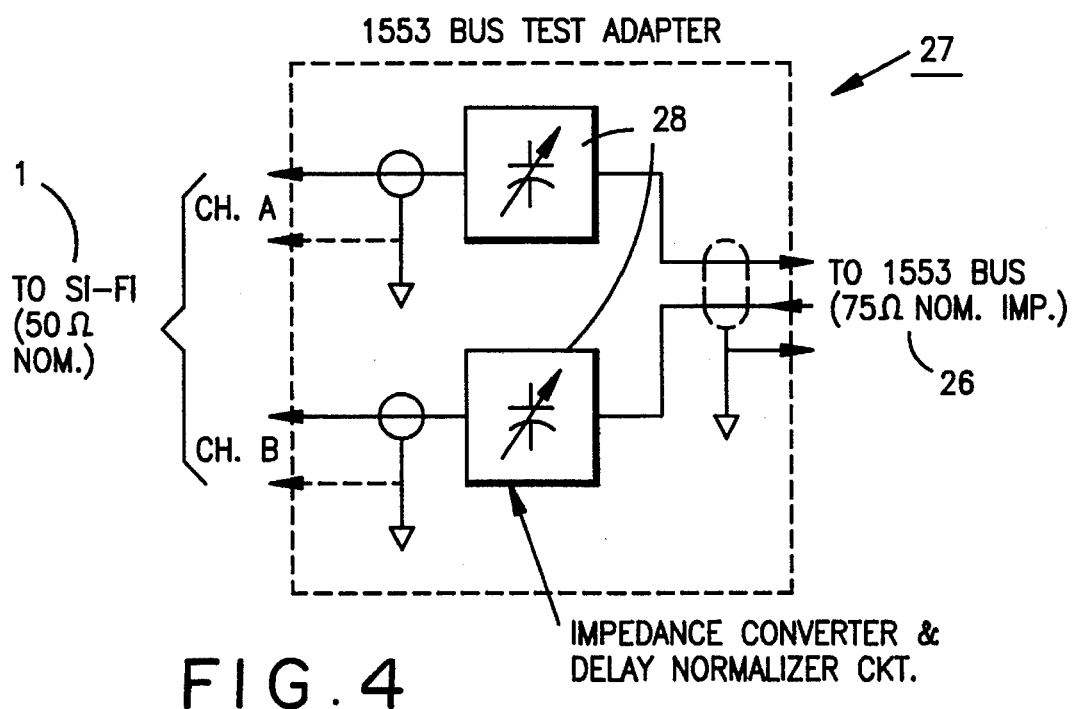
FIG. 4 is a schematic drawing of a MIL-STD-1553 bus test adaptor for the SI-FI unit of FIG. 1.

In order to detect and isolate faults in parallel buses, a thru-line bus test adaptor 19, which is connected to the MCU 2, is inserted between a bus controller 20 and a remote terminal 21. The adaptor 19 is made up of a bus isolator 22, a plurality of driver/receiver pairs 23 and a reconfigurable test interface 25, as shown in FIG. 4. The bus isolator 22 provides a signal path for the digital data while DC-isolating the bus controller from the remote terminal. This allows, for example, a stuck condition at the remote terminal inputs to be detected, without affecting the outputs of the bus controller 20. The receivers 24 and the reconfigurable test interface 25 are used to enable the MCU 2 to diagnose a bus controller output fault, while the drivers and the reconfigurable test interface 25 will detect and isolate a remote terminal fault under MCU control. Fault isolation is preferably aided by a fault matrix generated by the MCU software. Under normal use, the adaptor 19 is inserted between the bus controller 20 and a suspected remote terminal 21. The bus controller is programed to transmit a known data stream, which is monitored by the MCU. If this test passes, then the MCU will transmit data to the remote terminal. By proper selection of the point where the adaptor is inserted, all types of faults, including stuck inputs, open/short wiring, and dead outputs can be detected and isolated. The adaptor 19 can be reconfigured by software uploaded from the MCU 2, and therefore a single bus test adaptor 19 can be used on a variety of parallel data buses.

Figure 5:
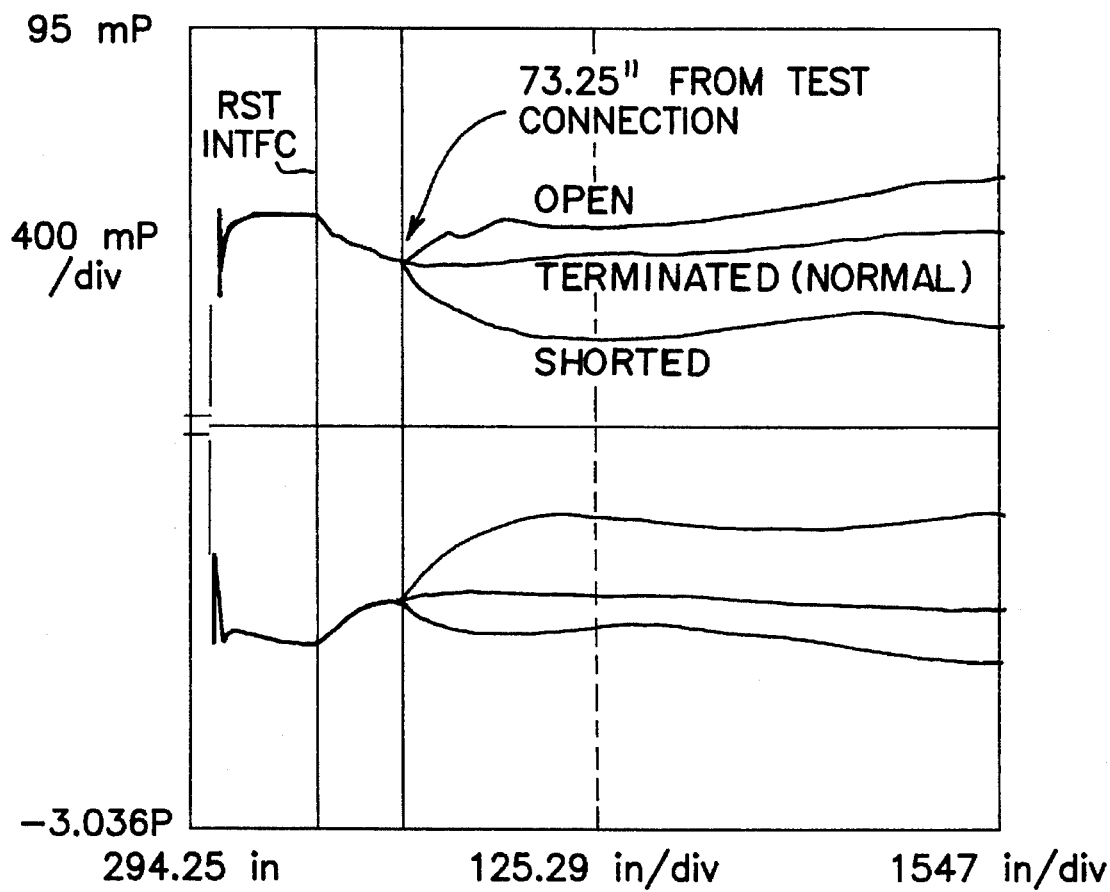
FIG. 5 is a graph showing the results of differential TDR testing of a MIL-STD-1553 bus for a practical implementation of the SI-FI unit of FIG. 1.
Figure 6:
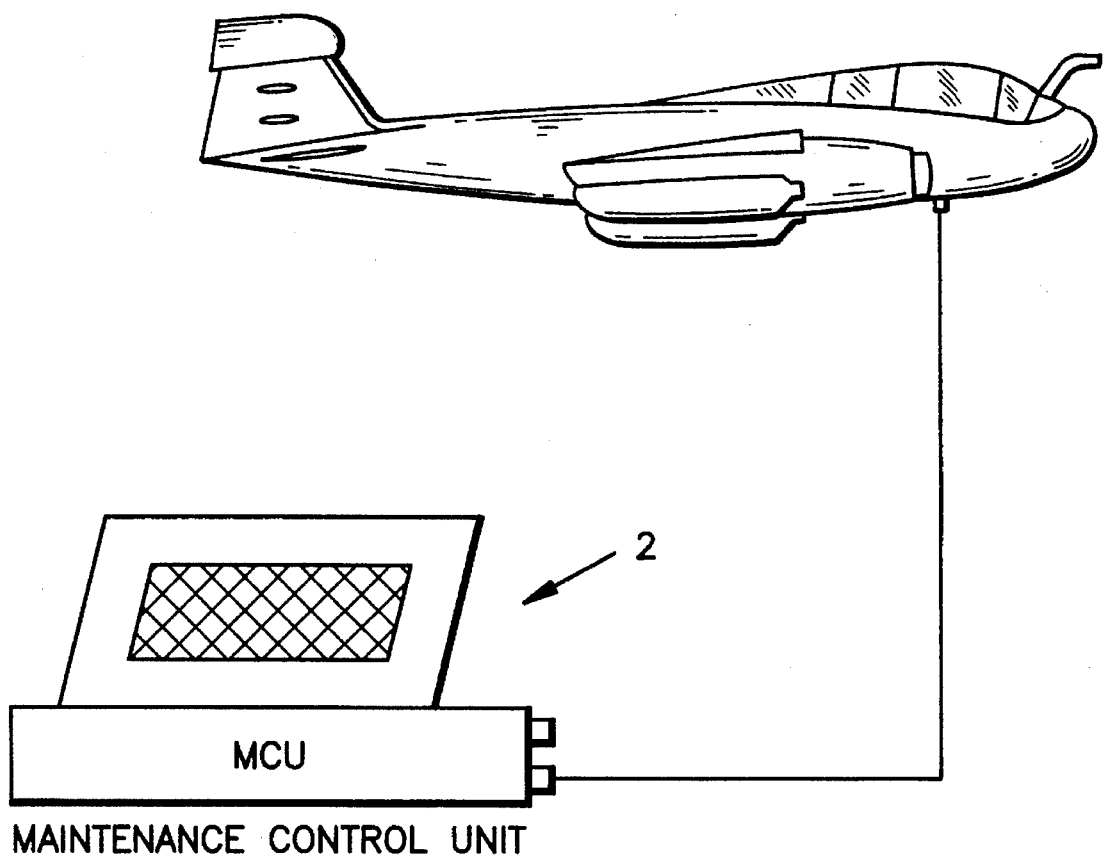
FIG. 6 illustrates a manner in which the maintenance control unit of the SI-FI unit of FIG. 1 serves as a terminal to download a Built-In Test results data base from an Aircraft-Under-Test.

The SI-FI apparatus may also be directly interfaced to a MIL-STD-1553 bus 26 by means of the 1553 bus test adaptor 27 illustrated in FIG. 5. The MIL-STD-1553 bus test adaptor includes two identical impedance converter/delay normalizer circuits 28 of known type which allow the SI-FI TDR capability to be used on the differential bus. Measurements are made by means of the TDR section 1 under MCU 2 control to detect and isolate faults on the bus 26. The measurements produce unique, fault specific results, as shown in FIG. 6. All types of faults, including open/short circuited wiring, single-line opens, and so forth, can be detected. As a possible test scenario, the bus signature of an entire aircraft or other UUT could optionally be stored in the MCU mass storage 16, so that it may be used at a later time as a go/no-go test limit, expediting the testing process.

Because the MCU 2 is packaged in a laptop type casing separable from the measurement unit, the MCU has the advantage that it can be used as a stand-alone interface and control device to devices such as aircraft central mission computers or air data computers. In this capacity, the MCU can command the aircraft device to enter and execute Built-In Test, at the conclusion of which the test result data can be downloaded from the aircraft device for later use, as illustrated in FIG. 6.

Finally, the TDR section 1 may include additional instruments 29 which can include but are not limited to: 1) an RF signal source of known type to be used as a test signal source for measuring UUT frequency response, RF path insertion loss or to perform frequency domain reflectometry on waveguide devices; 2) an optical TDR device for performing tests on fiber-optic communication devices; 3) any other measurement device of known type as the intended use specifies.

As a result of the above features, each of which will be easily implemented by those skilled in the art based on the above description, the preferred SI-FI apparatus can be used for at least the following purposes: 1) a multi-purpose operational level Navy, Air Force, and Army tester, 2) a maintenance control unit for aircraft which downloads aircraft BIT status data for post-flight analysis, 3) a digital storage scope, 4) a 1553 bus analyzer, 5) a TDR tester with highly accurate distance-to-fault measurement capability, 6) a VSWR tester for RF paths and antennas, 7) a parallel bus and 1553 bus interface tester and fault isolator, 8) a waveform signature analyzer and comparator, 9) a time-matched cable tester, 10) a phase-matched cable tester, 11) an impedance and path loss tester, 12) a frequency domain reflectometer for waveguide test, 13) an optical TDR tester and 14) a multi-meter.

Since all test applications are programmable and stored in MCU mass storage 12, the SI-FI can be adapted to any modern aircraft and to a variety of other complex systems. Test directions and UUT documentation can also be stored in MCU to eliminate the need for hard copy instructions. The operator need only enter part number or UUT to be tested or select a test via the SI-FI menu and cursor control, after which all testing is automatic. Test analysis is performed via software with results displayed to the operator. Test results are also stored for later printouts if hard copy is required. Reference data can be stored on-line for particular systems to be tested, including UUT characteristics of a particular aircraft in a squadron if desired.

While a specific embodiment of the invention has been described in sufficient detail to enable one skilled in the art to make and use the invention, it is anticipated that variations and modifications of the disclosed embodiment will occur to the skilled artisan and therefore it is intended that the invention not be limited by the above description and accompanying illustration. Rather, it is intended that the invention be limited solely by the appended claims.

We claim:

1. A system interface fault isolator apparatus, comprising:
   TDR/oscilloscope measurement circuitry housed in a measurement unit, said TDR/oscilloscope measurement circuitry including
   means including a time domain reflectometer for performing time domain reflectometry tests on a signal cable, signal cable string, component in a system, or system interface in order to detect faults and determine their location; and
   means for measuring at least one parameter of a signal in said signal cable, signal cable string, component in a system, or system interface;
   means for connecting the TDR/oscilloscope measurement circuitry to an input switch means which selects an appropriate input channel of the measurement unit;
   means for connecting the measurement unit to said signal cable, signal cable string, component in a system, or system interface under test;
   means for protecting the measurement unit from accidental ESD by discharging any capacitively stored energy present in said connection means before measurements are made;
   means for detecting a live circuit condition at the input of the measurement unit;
   a separate maintenance control unit which includes mass storage means for storing reference data, test limits data and test results data for a plurality of different components, systems or system interfaces under test;
   means for connecting the maintenance control unit to the TDR/oscilloscope measurement circuitry to cause the reflectometer to perform a measurement and upload test results data to the control unit, and processor means for comparing the test results data with reference and test limits data stored in the mass storage means of said control unit.

2. Apparatus as claimed in claim 1, wherein said measurement unit further comprises means for disconnecting the maintenance control unit from said measurement unit to allow stand alone use of said maintenance control unit.

3. Apparatus as claimed in claim 1, wherein said maintenance control unit further comprises means for disconnecting the maintenance control unit from the measurement unit to allow stand alone use of said maintenance control unit.

4. Apparatus as claimed in claim 1, wherein said measurement means includes means for performing measurements including impedance, frequency, voltage, rise time, pulse width and RF path loss in a unit under test, and wherein a bus architecture of the apparatus permits still further measurement performing means to be added as needed.

5. Apparatus as claimed in claim 1, wherein the maintenance control unit comprises means for performing a Fast Fourier Transform on the TDR data in order to obtain a voltage standing wave ratio (VSWR) profile of a component path.

6. Apparatus as claimed in claim 1, wherein the maintenance control unit includes means for downloading aircraft bit status data from an aircraft for post-flight analysis.

7. Apparatus as claimed in claim 1, wherein the TDR measurement unit and maintenance control unit each comprises its own power supply.

8. Apparatus as claimed in claim 1, further comprising a thru-line bus test adaptor for a parallel data bus, comprising means including a bus isolator placed between a bus controller and remote terminal for providing a signal path while DC isolating the bus controller from the remote terminal, a driver/receiver pair for each data and control line, and a reconfigurable test interface connected between the driver/receiver pairs and the maintenance control unit.

9. Apparatus as claimed in claim 1, further comprising a MIL-STD-1553 bus test adaptor which includes two identical impedance converter/delay normalization circuits connected between the time domain reflectometer and a MIL-STD-1553 bus, in order to perform differential TDR measurements on said MIL-STD-1553 bus.

10. Apparatus as claimed in claim 1, wherein said maintenance control unit and measurement unit are portable.

11. A system interface fault isolator apparatus, comprising: a portable measurement unit containing a plurality of test instruments connected by means including a bus to which additional instrument modules can be connected for performing different types of measurements on different types of interfaces; and a separate maintenance control unit which includes mass storage means for storing system interface data for a plurality of different system interfaces and processor means for comparing the system interface data with data obtained from said test instruments under control of a program in said maintenance control unit.

wherein said plurality of test instruments includes means for measuring at least one parameter of a signal in a signal cable, signal cable string, component in a system, or system interface, said at least one parameter including at least one parameter selected from the group consisting of: frequency, voltage, rise time, and pulse width; means for protecting the measurement unit from accidental ESD by discharging any capacitively stored energy present in a connection means before measurements are made; means for detecting a live circuit condition at the input of the measurement unit; and means for connecting the measurement unit to said signal cable, signal cable string, component in a system, or system interface under test and for connecting the maintenance control unit to the measurement unit to cause the measurement performing means to perform a measurement of said at least one parameter and upload test results data to the control unit.

12. Apparatus as claimed in claim 11, wherein said plurality of test instruments contained in said measurement unit includes an RF signal source.

13. Apparatus as claimed in claim 11, wherein said plurality of test instruments contained in said measurement unit includes an optical TDR.

14. Apparatus as claimed in claim 11, wherein said maintenance control unit further comprises means for disconnecting the maintenance control unit from the measurement unit to allow stand alone use.

15. Apparatus as claimed in claim 11, wherein said measurement unit includes instrument means for measuring impedance, frequencies, voltage, rise time, and RF path loss in a unit under test.

16. Apparatus as claimed in claim 11, wherein the maintenance control unit includes means for downloading aircraft bit status data from an aircraft for post-flight analysis.

17. Apparatus as claimed in claim 11, wherein said maintenance control unit includes means for directly connecting to a MIL-STD-1553 data bus, and means for allowing said maintenance control unit to operate either as a bus controller, a remote terminal or a bus analyzer on said MIL-STD-1553 bus.

18. Apparatus as claimed in claim 11, wherein said maintenance control unit includes means for directly connecting to an IEEE-488 data bus, and means for allowing said maintenance control unit to operate either as a controller-in-charge, a device or a bus analyzer on said IEEE-488 bus.

19. Apparatus as claimed in claim 11, wherein said mass storage means of said maintenance control unit is removable.

20. Apparatus as claimed in claim 11, further comprising a thru-line bus test adaptor for a parallel data bus, comprising means including a bus isolator, a driver/receiver pair for each data and control line and a reconfigurable test interface, wherein said reconfigurable test interface can be reconfigured by means of software uploaded from said maintenance control unit.

21. Apparatus as claimed in claim 11, further comprising a thru-line bus test adaptor for a parallel data bus, comprising means including a bus isolator, a driver/receiver pair for each data and control line and a reconfigurable test interface, wherein said driver/receiver pair can accomodate either unipolar or differential inputs and outputs.

* * * * *